(12) United States Patent
Then et al.

(10) Patent No.: US 11,610,887 B2
(45) Date of Patent: Mar. 21, 2023

(54) SIDE-BY-SIDE INTEGRATION OF III-N TRANSISTORS AND THIN-FILM TRANSISTORS

(71) Applicant: Intel Corporation, Santa Clara, CA (US)

(72) Inventors: Han Wui Then, Portland, OR (US); Marko Radosavljevic, Portland, OR (US); Sansaptak Dasgupta, Hillsboro, OR (US); Paul B. Fischer, Portland, OR (US); Walid M. Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 926 days.

(21) Appl. No.: 16/243,523

(22) Filed: Jan. 9, 2019

(65) Prior Publication Data
US 2020/0219878 A1  Jul. 9, 2020

(51) Int. Cl.
*H01L 27/092* (2006.01)
*H01L 29/20* (2006.01)
(Continued)

(52) U.S. Cl.
CPC ...... *H01L 27/0922* (2013.01); *H01L 21/8252* (2013.01); *H01L 23/34* (2013.01);
(Continued)

(58) Field of Classification Search
CPC . H01L 29/7869; H01L 23/34; H01L 27/0922; H01L 29/66969; H01L 29/7787; H01L 29/78696; H01L 29/7786; H01L 21/8258; H01L 29/205; H01L 21/8252; H01L 29/2003; H01L 27/1203; H01L 23/5385; H01L 29/66462; H01L 29/42384; H01L 23/49816; H01L 29/0847;
(Continued)

(56) References Cited

U.S. PATENT DOCUMENTS

| | | | |
|---|---|---|---|
| 2007/0045748 A1* | 3/2007 | Booth | H01L 27/0924 257/369 |
| 2007/0052027 A1* | 3/2007 | Ke | H01L 27/1207 257/351 |

(Continued)

*Primary Examiner* — Mouloucoulaye Inoussa
(74) *Attorney, Agent, or Firm* — Akona IP PC

(57) ABSTRACT

Disclosed herein are IC structures, packages, and devices that include thin-film transistors (TFTs) integrated on the same substrate/die/chip as III-N transistors. An example IC structure includes an III-N semiconductor material provided over a support structure, a III-N transistor provided over a first portion of the III-N material, and a TFT provided over a second portion of the III-N material. Because the III-N transistor and the TFT are both provided over a single support structure, they may be referred to as "integrated" transistors. Because the III-N transistor and the TFT are provided over different portions of the III-N semiconductor material, and, therefore, over different portion of the support structure, their integration may be referred to as "side-by-side" integration. Integrating TFTs with III-N transistors may reduce costs and improve performance, e.g., by reducing losses incurred when power is routed off chip in a multi-chip package.

20 Claims, 12 Drawing Sheets

(51) Int. Cl.

| | | |
|---|---|---|
| *H01L 29/205* | (2006.01) | |
| *H01L 29/778* | (2006.01) | |
| *H01L 29/423* | (2006.01) | |
| *H01L 21/8252* | (2006.01) | |
| *H01L 29/786* | (2006.01) | |
| *H01L 23/34* | (2006.01) | |
| *H01L 29/66* | (2006.01) | |

(52) U.S. Cl.
 CPC ........ *H01L 29/2003* (2013.01); *H01L 29/205* (2013.01); *H01L 29/42384* (2013.01); *H01L 29/66462* (2013.01); *H01L 29/66969* (2013.01); *H01L 29/7787* (2013.01); *H01L 29/7869* (2013.01); *H01L 29/78696* (2013.01)

(58) Field of Classification Search
 CPC ......... H01L 21/02639; H01L 21/02381; H01L 21/0445; H01L 21/0262; H01L 29/0657; H01L 21/02458; H01L 27/085; H01L 21/02439; H01L 21/0254; H01L 29/785; H01L 27/0248; H01L 29/66212; H01L 21/3081; H01L 21/845; H01L 29/66795; H01L 29/78612; H01L 29/78636; H01L 27/1211; H01L 29/1083; H01L 29/404; H01L 29/408; H01L 29/66681; H01L 29/402; H01L 29/7835; H01L 29/42368; H01L 29/42376; H01L 29/4983; H01L 29/7783
 USPC ............... 257/350, 331, 401, 328, 369, 351, 257/E21.632, E27.06, E21.616; 438/154, 438/275, 440, 153, 212
 See application file for complete search history.

(56) References Cited

U.S. PATENT DOCUMENTS

| | | | |
|---|---|---|---|
| 2007/0069293 A1* | 3/2007 | Kavalieros | H01L 21/823431 438/153 |
| 2007/0080409 A1* | 4/2007 | Seliskar | H01L 21/823487 257/E21.643 |
| 2009/0278196 A1* | 11/2009 | Chang | H01L 29/7851 438/440 |
| 2010/0019279 A1* | 1/2010 | Chen | H01L 27/0605 257/E21.403 |
| 2010/0155835 A1* | 6/2010 | Seliskar | H01L 29/66545 257/E21.632 |
| 2011/0115023 A1* | 5/2011 | Cheng | H01L 27/1211 257/E27.06 |
| 2013/0049136 A1* | 2/2013 | Wahl | H01L 21/823431 257/E27.06 |
| 2013/0052781 A1* | 2/2013 | Dai | H01L 27/1211 438/275 |
| 2015/0028426 A1* | 1/2015 | Ching | H01L 29/66795 438/283 |
| 2015/0102348 A1* | 4/2015 | Cai | H01L 29/735 257/69 |
| 2015/0228491 A1* | 8/2015 | Kang | H01L 29/66621 257/330 |
| 2016/0104703 A1* | 4/2016 | Parke | H01L 21/8252 438/275 |
| 2016/0104708 A1* | 4/2016 | Kim | H01L 29/0692 257/369 |
| 2017/0069598 A1* | 3/2017 | Nelson | H01L 23/5383 |
| 2017/0092726 A1* | 3/2017 | Nidhi | H01L 29/66795 |
| 2017/0236704 A1* | 8/2017 | Dasgupta | H01L 21/0265 257/76 |
| 2018/0138289 A1* | 5/2018 | Rachmady | H01L 29/66553 |
| 2018/0145164 A1* | 5/2018 | Dasgupta | H01L 29/2003 |
| 2019/0198627 A1* | 6/2019 | Then | H01L 29/66462 |
| 2020/0295170 A1* | 9/2020 | Dayeh | H01L 29/7787 |

* cited by examiner

SIDE-BY-SIDE INTEGRATION OF III-N TRANSISTORS AND THIN-FILM TRANSISTORS

BACKGROUND

Solid-state devices that can be used in high voltage and/or high frequency applications are of great importance in modern semiconductor technologies. For example, radio frequency (RF) integrated circuits (RFIC) and power management integrated circuits (PMIC) may be critical functional blocks in system on a chip (SoC) implementations. Such SoC implementations may be found in mobile computing platforms such as smartphones, tablets, laptops, netbooks, and the like. In such implementations, the RFIC and PMIC and RFIC are important factors for power efficiency and form factor, and can be equally or even more important than logic and memory circuits.

Due, in part, to their large band gap and high mobility, III-N material based transistors, such as gallium nitride (GaN) based transistors, may be particularly advantageous for high voltage and/or high frequency applications.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
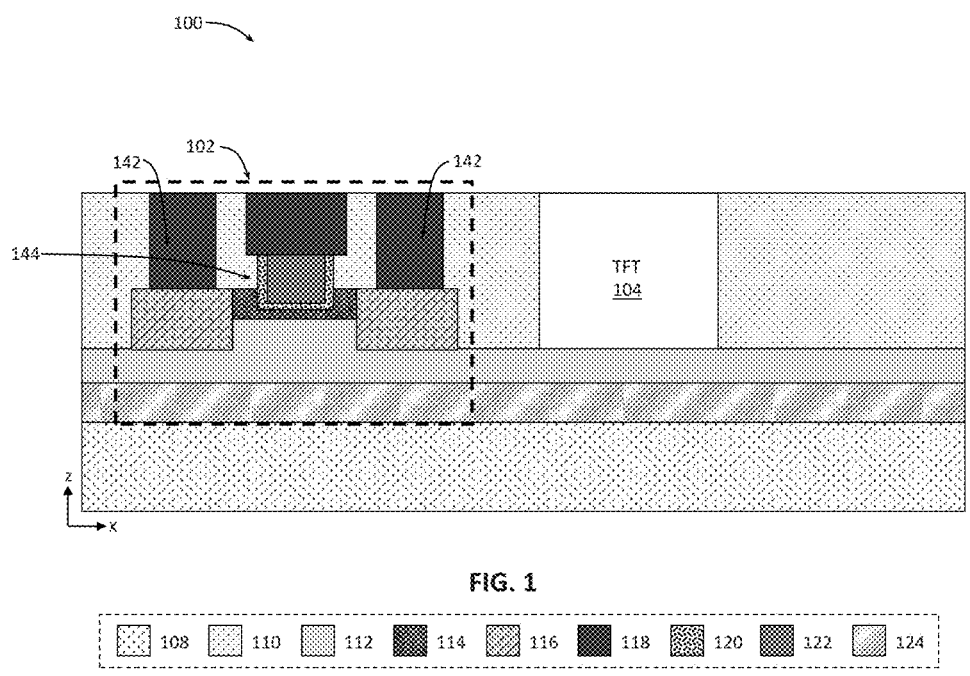
FIG. 1 provides a cross-sectional side view illustrating an integrated circuit (IC) structure that includes an III-N transistor and a thin-film transistor (TFT) integrated side-by-side with the III-N transistor, according to some embodiments of the present disclosure.

As mentioned above, III-N material based transistors have properties that make them particularly advantageous for certain applications. For example, because GaN has a larger band gap (about 3.4 electronvolts (eV)) than silicon (Si; band gap of about 1.1 eV), a GaN transistor is expected to withstand a larger electric field (resulting, e.g., from applying a large voltage to the drain, Vdd) before suffering breakdown, compared to a Si transistor of similar dimensions. Furthermore, GaN transistors may advantageously employ a 2D electron gas (2DEG) (i.e., a group of electrons, an electron gas, free to move in two dimensions but tightly confined in the third dimension, e.g., a 2D sheet charge) as its transport channel, enabling high mobilities without using impurity dopants. For example, the 2D sheet charge may be formed at an abrupt heterojunction interface formed by deposition (e.g., epitaxial deposition), on GaN, of a charge-inducing film of a material having larger spontaneous and piezoelectric polarization, compared to GaN (such a film is generally referred to as a "polarization layer"). Providing a polarization layer on an III-N material such as GaN allows forming very high charge densities without intentionally added impurity dopants, which, in turn, enables high mobilities.

Despite the advantages, there are some challenges associated with III-N transistors which hinder their large-scale implementation. One such challenge resides in the absence of viable low voltage (e.g., below about 5 volts) P-type metal-oxide-semiconductor (PMOS) transistors that can be built using III-N materials. Therefore, present III-N ICs are limited to using N-type metal-oxide-semiconductor (NMOS) transistors only. The standby current and good logic performance of such ICs are extremely challenging. In addition, since various devices require both PMOS and NMOS transistors, PMOS transistors have to be implemented (e.g., as conventional silicon front end of line (FEOL) transistors) on a chip separate from that housing the III-N ICs. A chip with PMOS silicon FEOL transistors and a chip with III-N transistors can then be connected with input/output (I/O) pins, in a multi-chip package (MCP). While such a solution may be acceptable for a small number of I/O pins, as logic solutions increase in complexity, the number of required I/O pins between the NMOS and PMOS chips increases as well, compromising the viability of this solution.

Disclosed herein are IC structures, packages, and device assemblies that include TFTs, monolithically integrated on the same support structure/material (which may be, e.g., a substrate, a die, or a chip) as III-N transistors. Embodiments of the present disclosure are based on recognition that TFTs may provide a viable approach to implementing PMOS transistors on the same support structure with III-N (i.e., NMOS) transistors, thus providing an integrated logic solution based on III-N transistor technology. In particular, according to various embodiments of the present disclosure, a TFT may be integrated with an III-N transistor by being disposed side-by-side with the III-N transistor, advantageously enabling implementation of both types of transistors in a single device layer.

In one aspect of the present disclosure, an IC structure is provided, the IC structure including an III-N semiconductor material (in the following, also referred to simply as an "III-N material") provided over a support structure (e.g., a substrate), a III-N transistor provided over a first portion of the III-N semiconductor material, and a TFT provided over a second portion of the III-N semiconductor material. Because the III-N transistor and the TFT are both provided over a single support structure, they may be referred to as "integrated" transistors. Because the III-N transistor and the TFT are provided over different portions of the III-N semiconductor material (and, therefore, over different portion of the support structure), their integration may be referred to as "side-by-side" integration (as opposed to, e.g., stacked integration where one transistor could be provided over another transistor). In this manner, one or more TFTs may, advantageously, be integrated with one or more III-N transistors, enabling monolithic integration of PMOS transistors, which may be provided by at least some of the TFTs, on a single chip with NMOS transistors, which may be provided by at least some of the III-N transistors. Such integration may reduce costs and improve performance, e.g., by reducing RF losses incurred when power is routed off chip in an MCP. Side-by-side arrangement of III-N transistors and TFTs provides a further advantage of the ability to share at least some of the fabrication processes used to manufacture these transistors (i.e., the ability to use a single fabrication process to form a portion of a III-N transistor and a portion of a TFT).

As used herein, the term "III-N material" refers to a compound semiconductor material with a first sub-lattice of at least one element from group III of the periodic table (e.g., Al, Ga, In) and a second sub-lattice of nitrogen (N). As used herein, the term "III-N device" (e.g., an III-N transistor) refers to a device that includes an III-N material (which may include one or more different III-N materials, e.g., a plurality of different III-N materials stacked over one another) as an active material.

While various embodiments described herein refer to III-N transistors (i.e., transistors employing one or more III-N materials as an active channel material), these embodiments are equally applicable to any other III-N devices besides III-N transistors, such as III-N diodes, sensors, light-emitting diodes (LEDs), and lasers (i.e., other device components employing one or more III-N materials as active materials). Furthermore, while the following discussions may refer to the two-dimensional charge carrier layers as "2DEG" layers, embodiments described herein are also applicable to systems and material combinations in which 2D hole gas (2DHG) may be formed, instead of 2DEG. Thus, unless stated otherwise, embodiments referring to 2DEG are equally applicable to implementing 2DHG instead, all of such embodiments being within the scope of the present disclosure.

Each of the structures, packages, methods, devices, and systems of the present disclosure may have several innovative aspects, no single one of which being solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," etc. refer to compounds containing, respectively, oxygen, carbon, nitrogen, etc. Similarly, the terms naming various compounds refer to materials having any combination of the individual elements within a compound (e.g., "gallium nitride" or "GaN" refers to a material that includes gallium and nitrogen, "aluminum indium gallium nitride" or "AlInGaN" refers to a material that includes aluminum, indium, gallium and nitrogen, and so on). Further, the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20%, preferably within +/−10%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 5A-5B, such a collection may be referred to herein without the letters, e.g., as "FIG. 5." In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated.

In the drawings, some schematic illustrations of example structures of various structures, devices, and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC structures that include at least one III-N device (e.g., a III-N transistor) integrated with at least one TFT over a single support structure as described herein may be implemented in one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on an IC, provided as an integral part of an IC, or those connected to an IC. The IC may be either analog or digital and may be used in a number of applications, such as microprocessors, optoelectronics, logic blocks, audio amplifiers, etc., depending on the components associated with the IC. In some embodiments, IC structures as described herein may be included in a RFIC, which may, e.g., be included in any component associated with an IC of an RF receiver, an RF transmitter, or an RF transceiver, e.g., as used in telecommunications within base stations (BS) or user equipment (UE). Such components may include, but are not limited to, power amplifiers, low-noise amplifiers, RF filters (including arrays of RF filters, or RF filter banks), switches, upconverters, downconverters, and duplexers. In some embodiments, the IC structures as described herein may be employed as part of a chipset for executing one or more related functions in a computer.

Integrating an III-N Transistor with a TFT

FIG. 1 provides a cross-sectional side view illustrating an IC structure 100 that includes an III-N device, e.g., an III-N transistor 102 (an approximate boundary of which is illustrated in FIG. 1 with a thick dashed line) integrated with a TFT 104, according to some embodiments of the present disclosure. A legend provided within a dashed box at the bottom of FIG. 1 illustrates colors/patterns used to indicate some classes of materials of some of the elements shown in FIG. 1, so that FIG. 1 is not cluttered by too many reference numerals. For example, FIG. 1 uses different colors/patterns to identify a support structure 108, an insulator 110, an III-N material 112, a polarization material 114, source/drain (S/D) regions 116 of the III-N transistor 102, an electrically conductive material 118 used to implement contacts to various transistor terminals, a gate dielectric material 120 of the III-N transistor 102, a gate electrode material 122 of the III-N transistor 102, and a buffer material 124.

The support structure 108 may be any suitable structure, e.g., a substrate, a die, or a chip, on which TFTs and III-N transistors as described herein may be implemented. In some embodiments, the support structure 108 may include a semiconductor, such as silicon. In other implementations, the support structure 108 may include/be alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N or group IV materials.

In some embodiments, the support structure 108 may include a ceramic material, or any other non-semiconductor material. For example, in some embodiments, the support structure 108 may include glass, a combination of organic and inorganic materials, embedded portions having different materials, etc. Although a few examples of materials from which the support structure 108 may be formed are described here, any material that may serve as a foundation upon which at least one TFT and at least one III-N transistor as described herein may be built falls within the spirit and scope of the present disclosure.

Although not specifically shown in FIG. 1, in some embodiments, the support structure 108 of the IC structure 100 may include an insulating layer, such as an oxide isolation layer, provided thereon. For example, in some embodiments, a layer of the insulator 110 may be provided over the support structure 108 (not shown in FIG. 1). The insulator 110 may include any suitable insulating material, e.g., any suitable interlayer dielectric (ILD), to electrically isolate the semiconductor material of the support structure 108 from other regions of or surrounding the III-N transistor 102 and/or from other regions of or surrounding the TFT 104. Providing such an insulating layer over the support structure 108 may help mitigate the likelihood that conductive pathways will form through the support structure 108 (e.g., a conductive pathway between the S/D regions 116). Examples of the insulator 110 may include, in some embodiments, silicon oxide, silicon nitride, aluminum oxide, and/or silicon oxynitride. In general, the insulator 110 may be provided in various portions of the IC structure 100. In some embodiments, the insulator 110 may include a continuous insulator material encompassing at least portions of the III-N transistor 102 as well as at least portions of the TFT 104. In various embodiments, the insulator 110 may include different insulating materials in different portions of the IC structure 100.

In some embodiments, the III-N material 112 may be formed of a compound semiconductor with a first sub-lattice of at least one element from group III of the periodic table (e.g., Al, Ga, In), and a second sub-lattice of nitrogen (N). In some embodiments, the III-N material 112 may be a binary, ternary, or quaternary III-N compound semiconductor that is an alloy of two, three, or even four elements from group III of the periodic table (e.g., boron, aluminum, indium, gallium) and nitrogen.

In general, the III-N material 112 may be composed of various III-N semiconductor material systems including, for example, N-type or P-type III-N materials systems, depending on whether the III-N transistor 102 is an N-type or a P-type transistor. For some N-type transistor embodiments, the III-N material 112 may advantageously be an III-N material having a high electron mobility, such a, but not limited to GaN, InGaAs, InP, InSb, and InAs. For some $In_xGa_{1-x}As$ embodiments, In content (x) may be between 0.6 and 0.9, and advantageously is at least 0.7 (e.g., $In_{0.7}Ga_{0.3}As$). For some such embodiments, the III-N material 112 may be a ternary III-N alloy, such as InGaN, or a quaternary III-N alloy, such as AlInGaN.

In some embodiments, the III-N material 112 may be a semiconductor material having a band gap greater than a band gap of silicon (i.e., greater than about 1.1 eV), preferably greater than 1.5 eV, or greater than 2 eV. Thus, in such embodiments, the III-N material 112 may include, e.g., GaN, AlN, or any alloy of Al, Ga, and N, but not InN because InN has a band gap of only about 0.65 eV. Such embodiments where the III-N material 112 is a wide-band gap material may be particularly advantageous when the channel material of the TFT 104 is provided directly on the III-N material 112, or over a thin intermediate layer of another material, as a wide-band gap III-N material 112 would assist electrical isolation from the channel material of the TFT 104, while providing mechanical support for the TFT 104.

In some embodiments, the III-N material 112 may be formed of a highly crystalline semiconductor, e.g., of substantially a monocrystalline semiconductor (possibly with some limited amount of defects, e.g., dislocations). The quality of the III-N material 112 (e.g., in terms of defects or crystallinity) may be higher than that of other III-N materials of, or near, the III-N transistor 102 since, during the operation of the III-N transistor 102, a transistor channel will form in the III-N material 112. A portion of the III-N material 112 where a transistor channel of the III-N transistor 102 forms during operation may be referred to as a "III-N channel material/region" of the III-N transistor 102.

In some embodiments, the III-N material 112 may be an intrinsic III-N semiconductor material or alloy, not intentionally doped with any electrically active impurity. In alternate embodiments, one or more a nominal impurity dopant level may be present within the III-N material 112, for example to set a threshold voltage Vt of the III-N transistor 102, or to provide halo pocket implants, etc. In such impurity-doped embodiments however, impurity dopant level within the III-N material 112 may be relatively low, for example below $10^{15}$ dopants per cubic centimeter ($cm^{-3}$), or below $10^{13}$ $cm^{-3}$.

In various embodiments, a thickness of the III-N material 112 may be between about 5 and 2000 nanometers, including all values and ranges therein, e.g., between about 50 and 1000 nanometers, or between about 10 and 50 nanometers. Unless specified otherwise, all thicknesses described herein refer to a dimension measured in a direction perpendicular to the support structure 108.

Turning now to the polarization material 114 of the III-N transistor 102, in general, the polarization material 114 may be a layer of a charge-inducing film of a material having larger spontaneous and/or piezoelectric polarization than that of the bulk of the III-N layer material immediately below it (e.g., the III-N material 112), creating a heterojunction (i.e., an interface that occurs between two layers or regions of semiconductors having unequal band gaps) with the III-N material 112, and leading to formation of 2DEG at or near (e.g., immediately below) that interface, during operation of the III-N transistor 102. As described above, a 2DEG layer may be formed during operation of an III-N transistor in a layer of an III-N semiconductor material immediately below a suitable polarization layer. In various embodiments, the polarization material 114 may include materials such as AlN, InAlN, AlGaN, or $Al_xIn_yGa_{1-x-y}N$, and may have a thickness between about 1 and 50 nanometers, including all values and ranges therein, e.g., between about 5 and 15 nanometers or between about 10 and 30 nanometers.

As also shown in FIG. 1, the III-N transistor 102 may include two S/D regions 116, where one of the S/D regions 116 is a source region and another one is a drain region, where the "source" and the "drain" designations may be interchangeable. As is well-known, in a transistor, S/D regions (also sometimes interchangeably referred to as "diffusion regions") are regions that can supply charge carriers for the transistor channel (e.g., the transistor channel 112) of the transistor (e.g., the III-N transistor 102). In some embodiments, the S/D regions 116 may include highly doped semiconductor materials, such as highly doped InGaN. Often, the S/D regions may be highly doped, e.g., with dopant concentrations of at least above $1 \cdot 10^{21}$ $cm^{-3}$, in order to advantageously form Ohmic contacts with the respective S/D electrodes of the III-N transistor 102 (e.g., electrodes 142 shown in FIG. 1, made of the electrically conductive material 118), although these regions may also have lower dopant concentrations in some implementations. Regardless of the exact doping levels, the S/D regions 116 are the regions having dopant concentration higher than in other regions between the source region (e.g., the S/D region 116 shown on the left side in FIG. 1) and the drain region (e.g., the S/D region 116 shown on the right side in FIG. 1), i.e., higher than the III-N material 112. For that reason, sometimes the S/D regions are referred to as highly doped (HD) S/D regions. In further embodiments, one or more layers of metal and/or metal alloys may be used to form the S/D regions 116.

The electrically conductive material 118 of the S/D electrodes 142 may include any suitable electrically conductive material, alloy, or a stack of multiple electrically conductive materials. In some embodiments, the electrically conductive material 118 may include one or more metals or metal alloys, with metals such as copper, ruthenium, palladium, platinum, cobalt, nickel, hafnium, zirconium, titanium, tantalum, and aluminum, tantalum nitride, titanium nitride, tungsten, doped silicon, doped germanium, or alloys and mixtures of these. In some embodiments, the electrically conductive material 118 may include one or more electrically conductive alloys, oxides, or carbides of one or more metals. In some embodiments, the electrically conductive material 118 may include a doped semiconductor, such as silicon or another semiconductor doped with an N-type dopant or a P-type dopant. Metals may provide higher conductivity, while doped semiconductors may be easier to pattern during fabrication. In some embodiments, the S/D electrodes 142 may have a thickness between about 2 nanometers and 1000 nanometers, preferably between about 2 nanometers and 100 nanometers. FIG. 1 further illustrates that the electrically conductive material 118 may also be used to form electrical contact to the gate electrode of the III-N transistor 102 (i.e., in general, the electrically conductive material 118 may also be used to form electrical contacts to any of the transistor terminals of the III-N transistor 102), while FIGS. 2A-2D illustrate that the electrically conductive material 118 may also be used to form electrical contacts to any of the transistor terminals of the TFT 104. In various embodiments, the exact material compositions of the electrically conductive material 118 may be different when used to implement contacts to different electrodes of different transistors within the IC structure 100.

FIG. 1 further illustrates a gate stack 144 provided over the channel portion of the III-N material 112. The gate stack 144 may include a layer of a gate dielectric material 120, and a gate electrode material 122.

The gate dielectric material 120 is typically a high-k dielectric material, e.g., a material including elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric material 120 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric material 120 during manufacture of the III-N transistor 102 to improve the quality of the gate dielectric material 120. A thickness of the gate dielectric material 120 may be between 0.5 nanometers and 3 nanometers, including all values and ranges therein, e.g., between 1 and 3 nanometers, or between 1 and 2 nanometers.

The gate electrode material 122 may include at least one P-type work function metal or N-type work function metal, depending on whether the III-N transistor 102 is a PMOS transistor or an NMOS transistor (e.g., P-type work function metal may be used as the gate electrode material 122 when the transistors 102 is a PMOS transistor and N-type work function metal may be used as the gate electrode material 122 when the III-N transistor 102 is an NMOS transistor, depending on the desired threshold voltage). For a PMOS transistor, metals that may be used for the gate electrode material 122 may include, but are not limited to, ruthenium, palladium, platinum, cobalt, nickel, titanium nitride, and conductive metal oxides (e.g., ruthenium oxide). For an NMOS transistor, metals that may be used for the gate electrode material 122 include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and nitrides of these metals (e.g., tantalum nitride, and tantalum aluminum nitride). In some embodiments, the gate electrode material 122 may include a stack of two or more metal layers, where one or more metal layers are work function metal layers and at least one metal layer is a fill metal layer.

Further layers may be included next to the gate electrode material 122 for other purposes, such as to act as a diffusion barrier layer or/and an adhesion layer, not specifically shown in FIG. 1. Furthermore, in some embodiments, the gate dielectric material 120 and the gate electrode material 122 may be surrounded by a gate spacer, not shown in FIG. 1, configured to provide separation between the gates of different transistors. Such a gate spacer may be made of a low-k dielectric material (i.e., a dielectric material that has a lower dielectric constant (k) than silicon dioxide which has a dielectric constant of 3.9). Examples of low-k materials that may be used as the dielectric gate spacer may include, but are not limited to, fluorine-doped silicon dioxide, carbon-doped silicon dioxide, spin-on organic polymeric dielectrics such as polyimide, polynorbornenes, benzocyclobutene, and polytetrafluoroethylene (PTFE), or spin-on silicon-based polymeric dielectric such as hydrogen silsesquioxane (HSQ) and methylsilsesquioxane (MSQ)). Other examples of low-k materials that may be used as the dielectric gate spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1.

In some embodiments, the IC structure 100 may, optionally, include a buffer material 124 between the III-N material 112 and the support structure 108. In some embodiments, the buffer material 124 may be a layer of a semiconductor material that has a band gap larger than that of the III-N material 112, so that the buffer material 124 can serve to prevent current leakage from the future III-N transistor to the support structure 108. A properly selected semiconductor for the buffer material 124 may also enable better epitaxy of the III-N material 112 thereon, e.g., it may improve epitaxial growth of the III-N material 112, for instance in terms of a bridge lattice constant or amount of defects. For example, a semiconductor that includes aluminum, gallium, and nitrogen (e.g., AlGaN) or a semiconductor that includes aluminum and nitrogen (e.g., AlN) may be used as the buffer material 124 when the III-N material 112 is a semiconductor that includes gallium and nitrogen (e.g., GaN). Other examples of materials for the buffer material 124 may include materials typically used as ILD, described above, such as oxide isolation layers, e.g., silicon oxide, silicon nitride, aluminum oxide, and/or silicon oxynitride. When implemented in the III-N transistor 102, the buffer material 124 may have a thickness between about 100 and 5000 nm, including all values and ranges therein, e.g., between about 200 and 1000 nanometers, or between about 250 and 500 nanometers.

Although not specifically shown in FIG. 1, the IC structure 100 may further include additional transistors similar to the III-N transistor 102, described above.

Turning now to the TFT 104, FIG. 1 only provides a schematic illustration that the TFT 104 may be provided to the side of the III-N transistor 102. In particular, both the III-N transistor 102 and the TFT 104 may be seen as being implemented in a single layer above the support structure 108. In some embodiments, both the III-N transistor 102 and the TFT 104 may be implemented as FEOL transistors. In other embodiments, both the III-N transistor 102 and the TFT 104 may be implemented as back end of line (BEOL) transistors. In general, FEOL and BEOL refer to different layers, or different fabrication processes used to manufacture different portions of IC devices (e.g., logic devices) in context of complementary metal-oxide-semiconductor (CMOS) processes. In some embodiments, at least portions of the III-N transistor 102 and the TFT 104 may be implemented in the same metal layer of a metallization stack of the IC structure 100.

A TFT is a special kind of a field-effect transistor (FET), made by depositing a thin film of an active semiconductor material, as well as a dielectric layer and metallic contacts, over a supporting layer that may be a non-conducting layer. During operation of a TFT, at least a portion of the active semiconductor material forms a channel of the TFT, and, therefore, the thin film of such active semiconductor material is referred to herein as a "TFT channel material." This is different from conventional, non-TFT, transistors where the active semiconductor channel material is typically a part of a semiconductor substrate, e.g., a part of a silicon wafer. Using the TFT 104 as a PMOS transistor integrated side-by-side with the III-N transistor 102 provides several advantages and enables unique architectures that were not possible with conventional transistors, although embodiments described herein are not limited to the TFT 104 being a PMOS transistor.

In various embodiments, the TFT 104 may be a TFT of any suitable architecture, e.g., a top-gated TFT or a back-gated TFT, with or without fins, etc., as known in the art. FIGS. 2A-2D illustrate different example manners in which the TFT 104 may be implemented, according to some embodiments of the present disclosure. In particular, the IC structures 200A, 200B, 200C, and 200D (together referred to as "IC structures 200"), shown in FIGS. 2A-2D, may be seen as examples of the IC structure 100 shown in FIG. 1 with the TFT 104 being implemented according to different example variations of a top-gated TFT. In particular, each of FIGS. 2A-2D illustrate two cross-sections of the IC structures 200: a x-z cross-section (shown on the left side of FIGS. 2A-2D, the cross-section analogous to that shown in FIG. 1), and a y-z cross-section (shown on the right side of FIGS. 2A-2D), where the y-z cross section is a cross-section along the plane shown in the x-z cross-section of FIGS. 2A-2D with a line 202. Descriptions provided with reference to FIG. 1 are applicable to the IC structures 200 of FIGS. 2A-2D and, in the interests of brevity, are not repeated here. Instead, only the differences are described. Similar to FIG. 1, a legend provided within a dashed box at the bottom of each of FIGS. 2A-2D illustrates colors/patterns used to indicate some classes of materials of some of the elements shown in FIGS. 2A-2D. In addition to the reference numerals used in FIG. 1 and described above, each of FIGS. 2A-2D illustrates with different colors/patterns a TFT channel material 126, a cladding insulator 128, a gate dielectric material 130 of the TFT 104, a gate electrode material 132 of the TFT 104, and S/D regions 206 of the TFT 104.

Figure 2A:
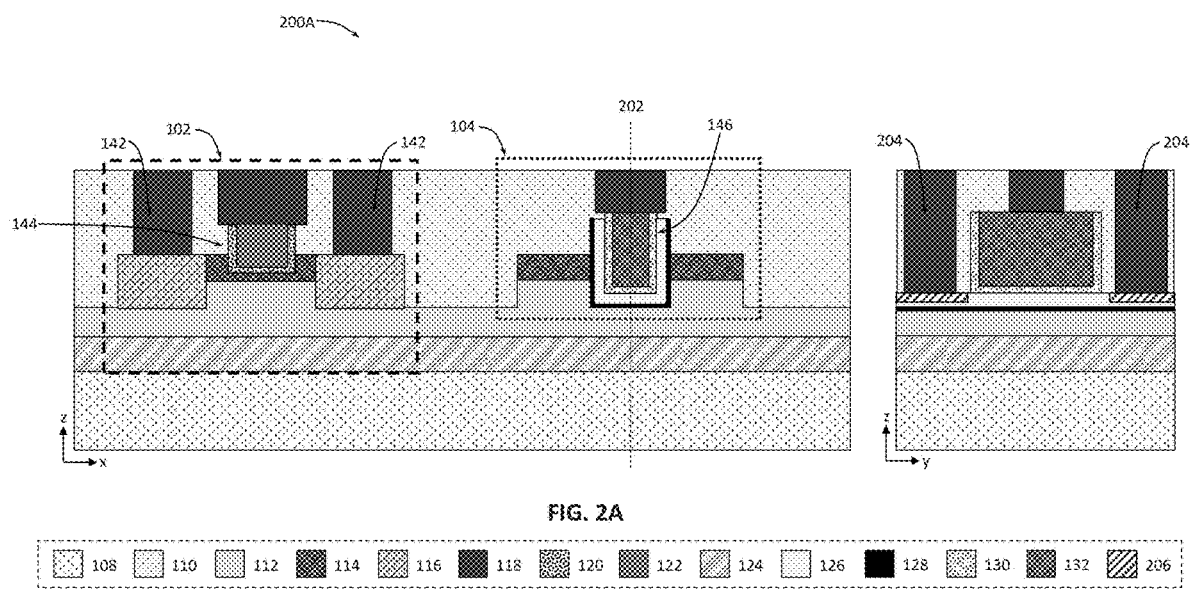
FIGS. 2A-2D provide cross-sectional side views illustrating different example implementations of a TFT integrated side-by-side with a III-N transistor within an IC structure, according to various embodiments of the present disclosure.
Figure 2B:
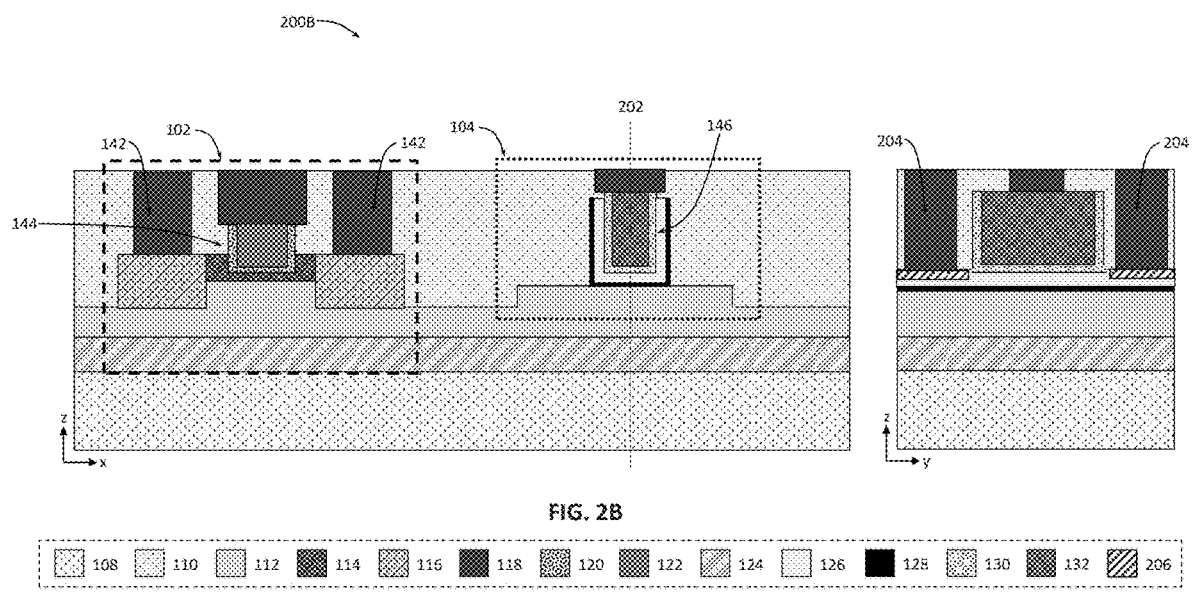
Figure 2C:
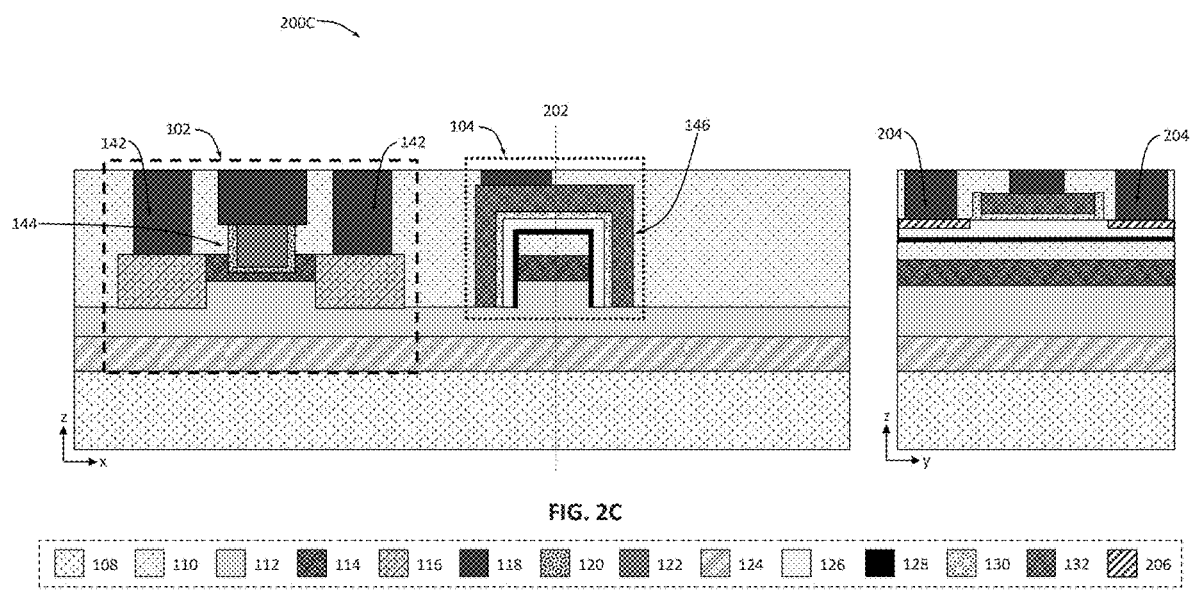
Figure 2D:
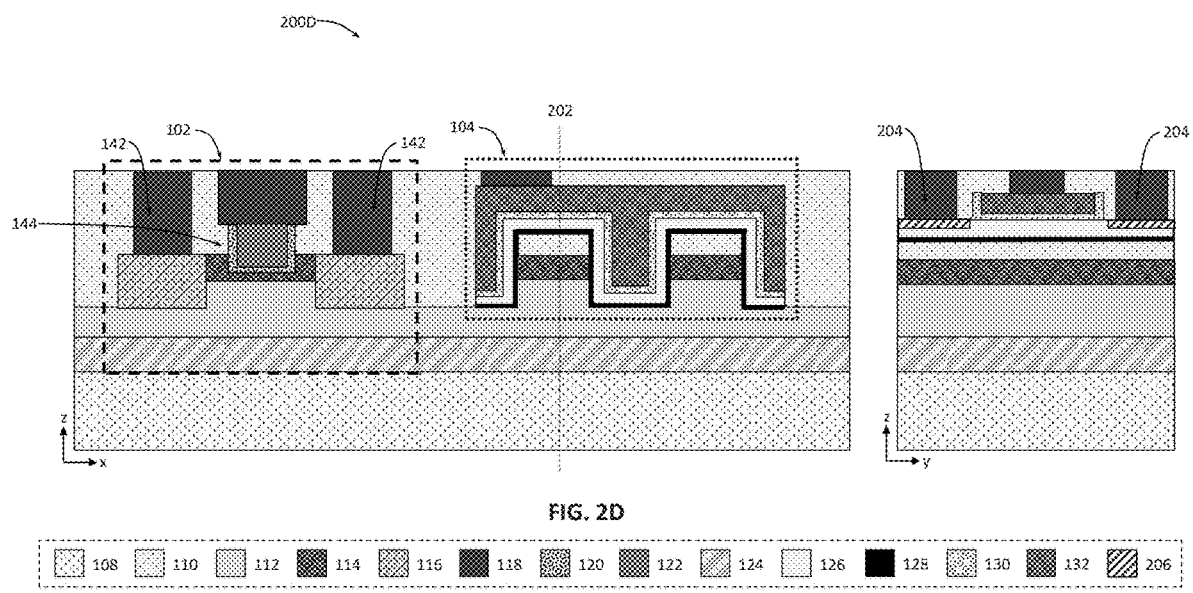

FIG. 2A illustrates an embodiment where the TFT channel material 126 is provided within an opening in the III-N material 112. FIG. 2B illustrates an embodiment where the TFT channel material 126 is provided within an opening in the insulator 110, over the III-N material 112. FIG. 2C illustrates an embodiment where the TFT channel material 126 is provided over a fin formed of, at least, a portion of the III-N material 112. FIG. 2D illustrates an embodiment where the TFT channel material 126 is provided both within an opening in the III-N material 112 and over a fin formed of, at least, a portion of the III-N material 112 (i.e., FIG. 2D is an illustration of how embodiments of FIGS. 2A and 2C may be combined). Forming either an opening or a fin (or any other protruding structure) may allow depositing more of the TFT channel material 126, which may lead to larger currents through the TFT channel material 126 during operation of the TFT 104. In various further embodiments not specifically shown in FIGS. 2A-2D, the TFT 104 may include any number of fins and/or openings, possibly combined as shown in FIG. 2D (i.e., adjacent fins and openings between the fins).

In various embodiments, e.g., in any of the embodiments shown in FIGS. 2A-2D, the TFT channel material 126 may be composed of semiconductor material systems including, for example, N-type or P-type materials systems. In some embodiments, the TFT channel material 126 may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the TFT channel material 126 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. In particular, the TFT channel material 126 may be formed of a thin-film material. Some such materials may be deposited at relatively low temperatures, which allows depositing them within the thermal budgets to avoid damaging other devices, such as the III-N transistor 102. In some embodiments, the TFT channel material 126 may have a thickness between about 5 and 30 nanometers, including all values and ranges therein.

As shown in each of FIGS. 2A-2D, in some embodiments, optionally, a layer of a cladding insulator 128 may be provided before the TFT channel material 126 is deposited. For example, for the embodiments of FIGS. 2A and 2B, the cladding insulator 128 may be deposited to line inner surfaces of an opening formed for providing the TFT channel material 126 therein as shown in these figures. For example, first, the cladding insulator 128 may be deposited into such an opening, followed by depositing the TFT channel material 126, thus sequentially lining the inner sidewalls and bottom of the opening. For the embodiment of FIG. 2C, the cladding insulator 128 may be deposited to line the outer surfaces of a fin formed for depositing the TFT channel material 126 thereon as shown in this figure. For example, first, the cladding insulator 128 may be deposited over such a fin, followed by depositing the TFT channel material 126, thus sequentially lining the outer sidewalls and top of the fin. In some embodiments, the cladding insulator 128 may include any of the insulating materials described, e.g., with reference to the insulator 110. In other embodiments, the cladding insulator 128 may include a semiconductor material having sufficiently large band gap to prevent current leakage from the TFT channel material 126.

As any FET, the TFT 104 further includes a gate stack of a gate dielectric material and a gate electrode material, shown in FIGS. 2A-2D as a gate stack 146 with a gate dielectric material 130 and a gate electrode material 132. In particular, FIGS. 2A-2D illustrate that, in some embodiments, the TFT 104 may be implemented as a top-gated (also referred to as "front-gated") TFT, which means that at least a portion of the TFT channel material 126 may be between at least a portion of the gate dielectric material 130 of the gate stack 146 of the TFT 104 and the support structure 108, and which also means that at least a portion of the gate dielectric material 130 of the gate stack 146 may be between at least a portion of the gate electrode material 132 of the gate stack 146 and the support structure 108. The top-gated architecture of the TFT 104 may be particularly suitable for integrating the TFT 104 side-by-side with the III-N transistor 102.

In general, the gate dielectric material 130 of the TFT 104 may include any of the materials listed for the gate dielectric material 120 of the III-N transistor 102. Similarly, in general, any of the materials listed for the gate electrode material 122 of the III-N transistor 102 may be suitable for implementing the gate electrode material 132 for the TFT 104.

In some embodiments, some of the materials listed above for the gate electrode material 122 may be used both as the gate electrode material 122 for the N-type III-N transistor 102 and as the gate electrode material 132 for the TFT 104 implemented as a PMOS transistor. For example, titanium nitride is a "mid-gap" material with a workfunction that is between N-type and P-type. Therefore, it may be suitable both for implementing the TFT 104 (e.g., polysilicon TFT) as a PMOS transistor to provide the desired PMOS threshold voltage, and also for implementing the III-N transistor 102 as an NMOS transistor to provide the desired NMOS threshold voltage. Using the same gate electrode material for the III-N transistor 102 and the TFT 104 may simplify fabrication as the gate electrode material for both of these transistors may then be deposited in a single deposition process. However, in other embodiments, the III-N transistor 102 and the TFT 104 may use different gate electrode materials.

In some embodiments, to implement an NMOS III-N transistor 102, the gate electrode material 122 may include one or more of hafnium, zirconium, titanium, tantalum, aluminum, alloys of these metals, and carbides of these metals (e.g., hafnium carbide, zirconium carbide, titanium carbide, tantalum carbide, and aluminum carbide), while to implement a PMOS TFT 104, the gate electrode material 132 may include ruthenium, palladium, platinum, cobalt, nickel, and conductive metal oxides (e.g., ruthenium oxide).

When the TFT 104 is implemented as a PMOS transistor, some of the TFT channel materials listed above for the TFT channel material 126 may be more suitable than others. Some examples of the TFT channel material 126 particularly suitable for a PMOS implementation of the TFT 104 include, but are not limited to, indium tin oxide, molybdenum diselenide, tungsten diselenide, and black phosphorus. On the other hand, some examples of the TFT channel material 126 particularly suitable for an NMOS implementation of the TFT 104 include, but are not limited to, zinc oxide, gallium oxide, titanium oxide, and IGZO.

Although not specifically shown in the present figures, in some embodiments, the gate electrode of the III-N transistor 102 may be electrically coupled to the gate electrode of the TFT 104. When the TFT 104 is implemented as a PMOS transistor, and the III-N transistor 102 is implemented as an NMOS transistor, such a configuration where the gates of these transistors are electrically coupled may be used to implement an inverter device.

In other embodiments of the IC structure 100, both the TFT 104 and the III-N transistor 102 may be implemented as NMOS devices, or both the TFT 104 and the III-N transistor 102 may be implemented as PMOS devices. In some such embodiments, the TFT 104 and the III-N transistor 102 may still have their gate electrodes coupled or shared (again, not specifically shown in the present figures). Such modified IC structures 100 may be included in any circuits that use cascaded transistors of the same type, such as gate protection circuits.

The x-z cross-sections of FIGS. 2A-2D do not specifically show S/D electrodes of the TFT 104 because these electrodes would be out of the plane of the drawings (i.e., one of the S/D electrodes could be in front of the plane of the drawings of FIGS. 2A-2D and the other one could be behind the plane of the drawings of FIGS. 2A-2D). However, the y-z cross-sections of FIGS. 2A-2D illustrate the S/D electrodes of the TFT 104 as the S/D electrodes 204. Similarly, the x-z cross-sections of FIGS. 2A-2D do not specifically show S/D regions of the TFT 104 because these regions would be out of the plane of the drawings, but the S/D regions of the TFT 104 are shown as the S/D regions 206 in the y-z cross-sections of FIGS. 2A-2D.

Similar to the S/D regions 116 of the III-N transistor 102, the S/D regions 206 of the TFT 104 include two S/D regions 206, where one of these two S/D regions 206 is a source region and another one is a drain region. Also similar to the S/D regions 116, the S/D regions 206 may include highly doped semiconductor materials. In some embodiments, the S/D regions 206 may be formed using an implantation/diffusion process or an etching/deposition process, for example. In the former process, dopants such as boron, aluminum, antimony, phosphorous, or arsenic may be ion-implanted into the TFT channel material 126 to form the S/D regions 206. An annealing process that activates the dopants and causes them to diffuse farther into the TFT channel material 126 may follow the ion-implantation process. In the latter process, the TFT channel material 126 may first be etched to form recesses at the locations of the S/D regions 206. An epitaxial deposition process may then be carried out to fill the recesses with material that is used to fabricate the S/D regions 206. In some implementations, the S/D regions 206 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 206 may be formed using one or more alternate semiconductor materials such as germanium or a group III-V material or alloy. In further embodiments, one or more layers of metal and/or metal alloys may be used to form the S/D regions 206.

S/D electrodes 204 of the TFT 104 may be provided above the TFT channel material 126, in particular, interfacing the S/D regions 206. In various embodiments, the same or different ones of the electrically conductive material 118 may be used to implement the S/D electrodes 142 of the III-N transistor 102 and the S/D electrodes 204 of the TFT 104.

Although not specifically shown in FIGS. 1-2, the IC structure 100 may further include additional TFTs similar to the TFT 104, described above.

In some embodiments, the IC structure 100 may be included in, or used to implement at least a portion of an RF FE. In some embodiments, the III-N transistor 102 of the IC structure 100 may be included in, or used to implement at least a portion of an RF circuit or a part of a power circuit included in the IC structure. In some embodiments, the TFT 104 of the IC structure 100 may be included in, or used to implement at least a portion of a temperature sensor circuit included in the IC structure, e.g., such a temperature sensor circuit may be configured to estimate temperature of the III-N transistor 102.

The IC structures 100 illustrated in FIGS. 1-2 do not represent an exhaustive set of assemblies in which one or more III-N transistors 102 may be integrated with one or more TFTs 104 over a single support structure 108 (e.g., a substrate), as described herein, but merely provide examples of such structures/assemblies. Although particular arrangements of materials are discussed with reference to FIGS. 1-2, intermediate materials may be included in various portions of these figures. Note that FIGS. 1-2 are intended to show relative arrangements of some of the components therein, and that various device components of these figures may include other components that are not specifically illustrated, e.g., various interfacial layers or various additional layers or elements. For example, although not specifically shown, the IC structure 100 may include a solder resist material (e.g., polyimide or similar material) and one or more bond pads formed on upper-most interconnect layer of the IC structure, e.g., at the top of the IC structure 100 shown in FIG. 1 or in FIG. 2. The bond pads may be electrically coupled with a further interconnect structure and configured to route the electrical signals between the III-N transistor 102 and other external devices, and/or between the TFT 104 and other external devices. For example, solder bonds may be formed on the one or more bond pads to mechanically and/or electrically couple a chip including the IC structure 100 with another component (e.g., a circuit board). The IC structure 100 may have other alternative configurations to route the electrical signals from the interconnect layers, e.g., the bond pads described above may be replaced by or may further include other analogous features (e.g., posts) that route the electrical signals to external components.

Additionally, although some elements of the IC structures are illustrated in FIGS. 1-2 as being planar rectangles or formed of rectangular solids, this is simply for ease of illustration, and embodiments of various ones of these elements may be curved, rounded, or otherwise irregularly shaped as dictated by, and sometimes inevitable due to, the manufacturing processes used to fabricate semiconductor device assemblies. For example, while FIGS. 1-2 may illustrate various elements, e.g., the S/D regions 116, the S/D electrodes 142, etc., as having perfectly straight sidewall profiles, i.e., profiles where the sidewalls extend perpendicularly to the support structure 108, these idealistic profiles may not always be achievable in real-world manufacturing processes. Namely, while designed to have straight sidewall profiles, real-world openings which may be formed as a part of fabricating various elements of the IC structures shown in FIGS. 1-2 may end up having either so-called "re-entrant" profiles, where the width at the top of the opening is smaller than the width at the bottom of the opening, or "non-re-entrant" profile, where the width at the top of the opening is larger than the width at the bottom of the opening. Oftentimes, as a result of a real-world opening not having perfectly straight sidewalls, imperfections may form within the materials filling the opening. For example, typical for re-entrant profiles, a void may be formed in the center of the opening, where the growth of a given material filling the opening pinches off at the top of the opening. Therefore, descriptions of various embodiments of integrating one or more III-N transistors with one or more TFTs provided herein are equally applicable to embodiments where various elements of such integrated structures look different from those shown in the figures due to manufacturing processes used to form them.

Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of the integration of one or more III-N transistors with one or more TFTs as described herein.

Manufacturing TFTs Integrated with III-N Transistors

Figure 3:
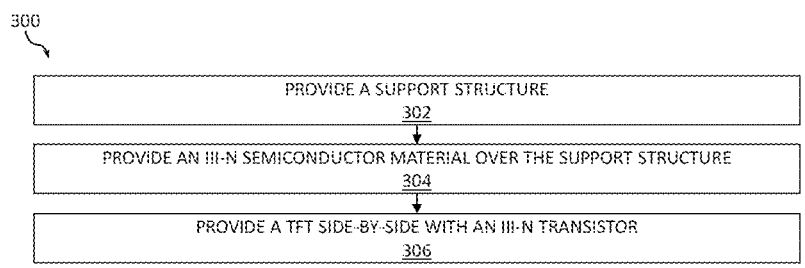
FIG. 3 is a flow diagram of an example method of manufacturing an IC structure that includes an III-N transistor and a TFT integrated side-by-side with the III-N transistor, in accordance with various embodiments of the present disclosure.
Figure 6:
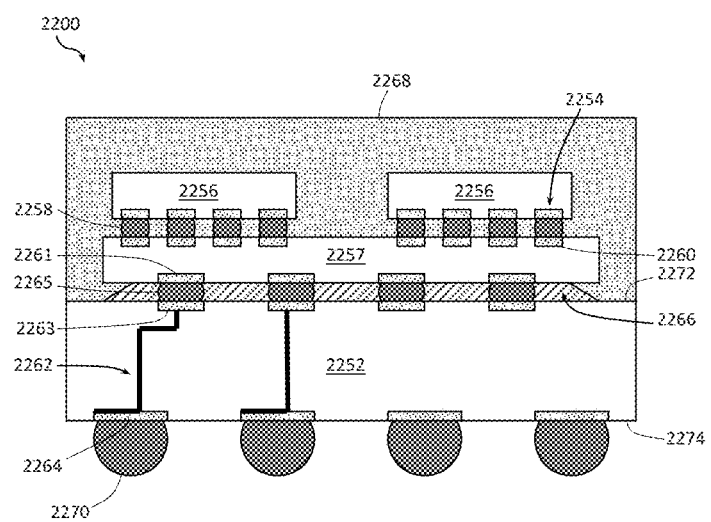
FIG. 6 is a cross-sectional side view of an IC package that may include one or more IC structures having one or more TFTs integrated side-by-side with one or more III-N transistors in accordance with any of the embodiments of the present disclosure.
Figure 7:
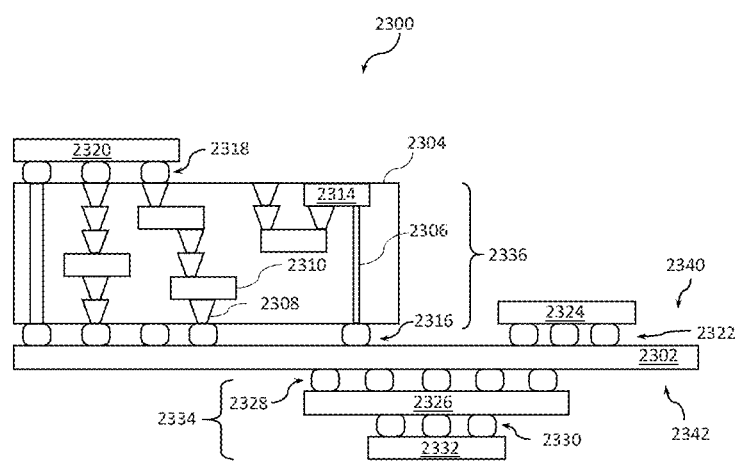
FIG. 7 is a cross-sectional side view of an IC device assembly that may include one or more IC structures having one or more TFTs integrated side-by-side with one or more III-N transistors in accordance with any of the embodiments of the present disclosure.
Figure 8:
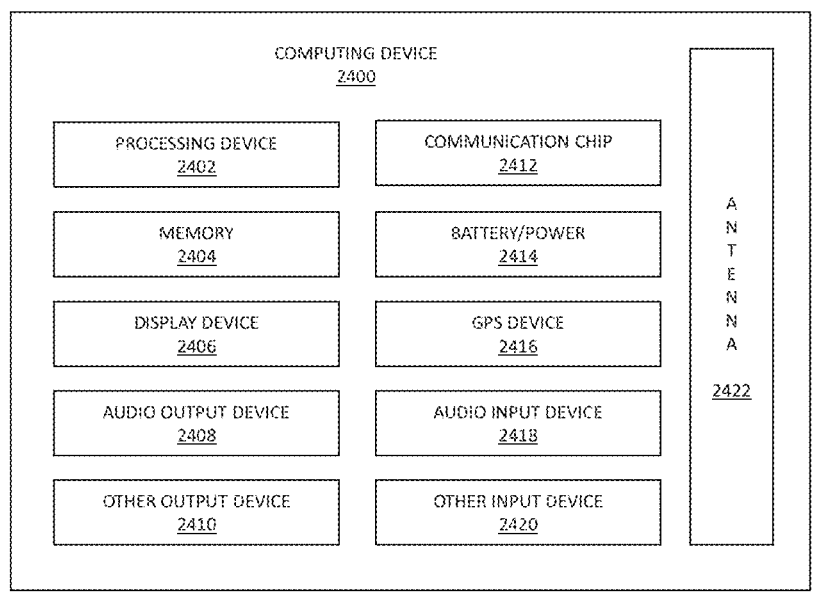
FIG. 8 is a block diagram of an example computing device that may include one or more IC structures having one or more TFTs integrated side-by-side with one or more III-N transistors in accordance with any of the embodiments of the present disclosure.

The IC structures implementing one or more III-N transistors integrated with one or more TFTs as described herein may be manufactured using any suitable techniques. FIG. 3 illustrates one example of such a method. However, other examples of manufacturing any of the IC structures described herein, as well as larger devices and assemblies that include such structures (e.g., as shown in FIGS. 6-8) are also within the scope of the present disclosure.

FIG. 3 is a flow diagram of an example method 300 of manufacturing an IC structure that includes an III-N transistor integrated with a TFT, in accordance with various embodiments of the present disclosure.

Although the operations of the method 300 are illustrated once each and in a particular order, the operations may be performed in any suitable order and repeated as desired. For example, one or more operations may be performed in parallel to manufacture, substantially simultaneously, multiple III-N transistors and/or multiple TFTs as described herein. In another example, the operations may be performed in a different order to reflect the structure of a particular device assembly in which one or more III-N transistors integrated with one or more TFTs as described herein will be included.

In addition, the example manufacturing method 300 may include other operations not specifically shown in FIG. 3, such as various cleaning or planarization operations as known in the art. For example, in some embodiments, the support structure 108, as well as layers of various other materials subsequently deposited thereon, may be cleaned prior to, after, or during any of the processes of the method 300 described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the structures/assemblies described herein may be planarized prior to, after, or during any of the processes of the method 300 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

Figure 4A:
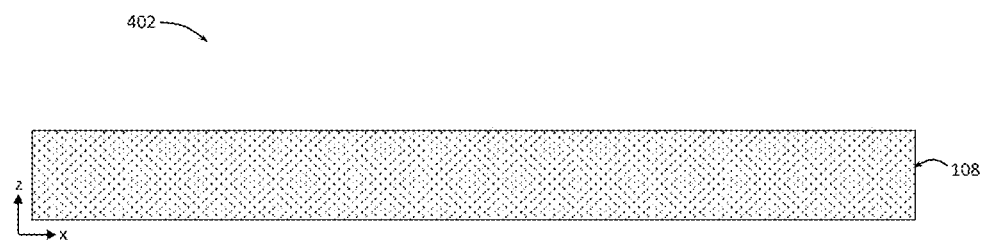
FIGS. 4A-4B are various views illustrating different example stages in the manufacture of an IC structure that includes an III-N transistor and a TFT integrated side-by-side with the III-N transistor using the method of FIG. 3, according to some embodiments of the present disclosure.
Figure 4B:
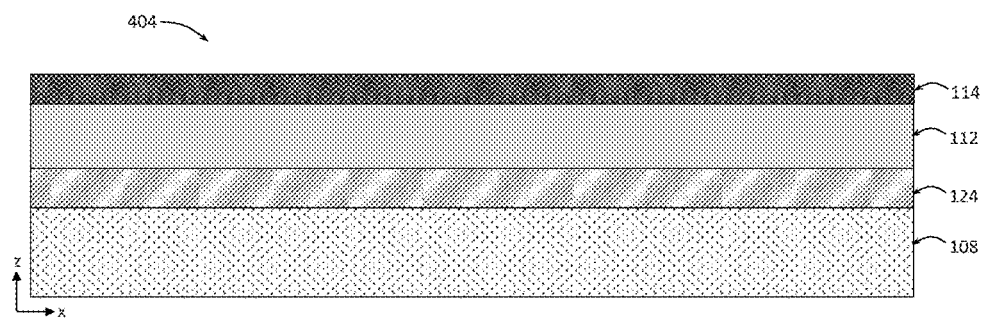

Various operations of the method 300 may be illustrated with reference to the example embodiments shown in FIGS. 4A-4B, illustrating fabrication of an IC structure as shown in any one of FIGS. 2A-2D, but the method 300 may be used to manufacture any suitable IC structures having one or more III-N transistors integrated with one or more TFTs according to any other embodiments of the present disclosure. FIGS. 4A-4B illustrate cross-sectional side views similar to the view shown in FIG. 1, in various example stages in the manufacture of an IC structure using the method of FIG. 3 in accordance with some embodiments of the present disclosure.

The method 300 may begin with providing a support structure (process 302 shown in FIG. 3, a result of which is illustrated with an IC structure 402 shown in FIG. 4A). The IC structure 402 illustrates that the support structure provided in 302 may be the support structure 108 as described above.

The method 300 may then proceed with providing a layer of an III-N semiconductor material over the support structure provided in 302 (process 304 shown in FIG. 3, a result of which is illustrated with an IC structure 404 shown in FIG. 4B). The IC structure 404 illustrates that, first, the buffer material 124 may be provided over the support structure 108, and then the III-N semiconductor material 112 may be provided over the buffer material 124. In some embodiments, the process 304 may also include depositing the polarization material 114 over the III-N semiconductor material 112.

In some embodiments, the process 304 may include epitaxially growing various transistor films, e.g., for forming the buffer material 124, the III-N channel layer 112, and the polarization material 114. In this context, "epitaxial growth" refers to the deposition of crystalline overlayers in the form of the desired materials. The epitaxial growth of various layers of the process 304 may be carried out using any known gaseous or liquid precursors for forming the desired material layers.

The method 300 may then proceed with providing a TFT and a III-N transistor, in a side-by-side arrangement, over the III-N semiconductor material provided in 304 (process 306 shown in FIG. 3, a result of which is not illustrated in FIG. 4 because the result could be, e.g., the IC structure 100 shown in FIG. 1 or any of the IC structures 200A, 200B, 200C, or 200D shown in FIG. 2, or any further embodiments of these IC structures as described herein).

In various embodiments, process 306 may include any suitable deposition and patterning techniques for fabricating portions of the III-N transistor 102 and the TFT 104. For example, any suitable deposition techniques may be used to deposit the insulator 110, such as, but not limited to, spin-coating, dip-coating, atomic layer deposition (ALD), physical vapor deposition (PVD) (e.g., evaporative deposition, magnetron sputtering, or e-beam deposition), or chemical vapor deposition (CVD). Examples of deposition techniques that may be used to provide various electrode materials include, but are not limited to, ALD, PVD (including sputtering), CVD, or electroplating. Examples patterning techniques which may be used in 306 may include, but are not limited to, photolithographic or electron-beam (e-beam) patterning, possibly in conjunction with a suitable etching technique, e.g., a dry etch, such as RF reactive ion etch (RIE) or inductively coupled plasma (ICP) RIE. In various embodiments, any of the etches performed in 306 may include an anisotropic etch, using etchants in a form of e.g., chemically active ionized gas (i.e., plasma) using e.g., bromine (Br) and chloride (Cl) based chemistries. In some embodiments, during any of the etches of the process 306, the IC structure may be heated to elevated temperatures, e.g., to temperatures between about room temperature and 200 degrees Celsius, including all values and ranges therein, to promote that byproducts of the etch are made sufficiently volatile to be removed from the surface.

Example Structures and Devices with III-N Transistors Integrated with TFTs

IC structures that include one or more III-N transistors integrated with one or more TFTs as disclosed herein may be included in any suitable electronic device. FIGS. 5-8 illustrate various examples of devices and components that may include one or more TFTs integrated side-by-side with one or more III-N transistors as disclosed herein.

Figures 5A, 5B:
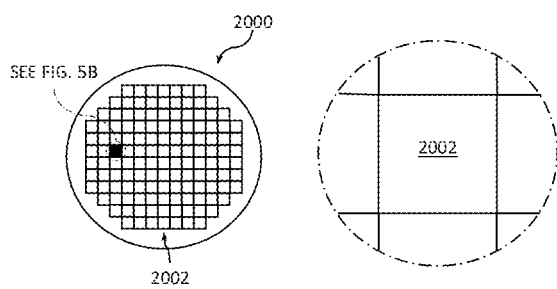
FIGS. 5A-5B are top views of a wafer and dies that include one or more IC structures having one or more TFTs integrated side-by-side with one or more III-N transistors in accordance with any of the embodiments of the present disclosure.

FIGS. 5A-5B are top views of a wafer 2000 and dies 2002 that may include one or more TFTs integrated side-by-side with one or more III-N transistors in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 6. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more III-N transistors integrated with one or more TFTs as described herein). After the fabrication of the semiconductor product is complete (e.g., after manufacture of one or more III-N transistors integrated with one or more TFTs as described herein, e.g., after manufacture of any embodiment of the IC structure 100 described herein), the wafer 2000 may undergo a singulation process in which each of the dies 2002 is separated from one another to provide discrete "chips" of the semiconductor product. In particular, devices that include one or more III-N transistors integrated with one or more TFTs as disclosed herein may take the form of the wafer 2000 (e.g., not singulated) or the form of the die 2002 (e.g., singulated). The die 2002 may include one or more transistors (e.g., one or more III-N transistors 102 as described herein), one or more TFTs (e.g., one or more TFTs 104 as described herein) as well as, optionally, supporting circuitry to route electrical signals to the III-N transistors and TFTs, as well as any other IC components. In some embodiments, the wafer 2000 or the die 2002 may implement an RF FE device, a memory device (e.g., a static random access memory (SRAM) device), a logic device (e.g., an AND, OR, NAND, or NOR gate), or any other suitable circuit element. Multiple ones of these devices may be combined on a single die 2002.

FIG. 6 is a side, cross-sectional view of an example IC package 2200 that may include one or more IC structures having one or more TFTs integrated side-by-side with one or more III-N transistors in accordance with any of the embodiments disclosed herein. In some embodiments, the IC package 2200 may be a system-in-package (SiP).

As shown in FIG. 6, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 6 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 6 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 6 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 7.

The dies 2256 may take the form of any of the embodiments of the die 2002 discussed herein and may include any of the embodiments of an IC structure having one or more III-N transistors integrated with one or more TFTs, e.g., any of the IC structures 100, described herein. In embodiments in which the IC package 2200 includes multiple dies 2256, the IC package 2200 may be referred to as a MCP. Importantly, even in such embodiments of an MCP implementation of the IC package 2200, one or more III-N transistors may be integrated with one or more TFTs in a single chip, in accordance with any of the embodiments described herein. The dies 2256 may include circuitry to perform any desired functionality. For example, one or more of the dies 2256 may be RF FE dies, including one or more III-N transistors integrated with one or more TFTs in a single die as described herein, one or more of the dies 2256 may be logic dies (e.g., silicon-based dies), one or more of the dies 2256 may be memory dies (e.g., high bandwidth memory), etc. In some embodiments, any of the dies 2256 may include one or more TFTs integrated side-by-side with one or more III-N transistors, e.g., as discussed above; in some embodiments, at least some of the dies 2256 may not include any III-N transistors integrated with TFTs.

The IC package 2200 illustrated in FIG. 6 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 6, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

FIG. 7 is a cross-sectional side view of an IC device assembly 2300 that may include components having one or more IC structures implementing one or more TFTs integrated side-by-side with one or more III-N transistors in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC structures implementing one or more III-N transistors integrated with one or more TFTs in accordance with any of the embodiments disclosed herein; e.g., any of the IC packages discussed below with reference to the IC device assembly 2300 may take the form of any of the embodiments of the IC package 2200 discussed above with reference to FIG. 6 (e.g., may include one or more III-N transistors integrated with one or more TFTs in/on a die 2256).

In some embodiments, the circuit board 2302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 7 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 7), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 5B), an IC device (e.g., the IC structure of FIGS. 1-2), or any other suitable component. In particular, the IC package 2320 may include one or more III-N transistors integrated with one or more TFTs as described herein. Although a single IC package 2320 is shown in FIG. 7, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 7, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as further RF devices, power amplifiers, power management devices, antennas, arrays, sensors, and microelectromechanical systems (MEMS) devices may also be formed on the interposer 2304. In some embodiments, the IC structures implementing one or more III-N transistors integrated with one or more TFTs as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 7 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

FIG. 8 is a block diagram of an example computing device 2400 that may include one or more components with one or more IC structures having one or more TFTs integrated side-by-side with one or more III-N transistors in accordance with any of the embodiments disclosed herein. For example, any suitable ones of the components of the computing device 2400 may include a die (e.g., the die 2002 (FIG. 5B)) including one or more III-N transistors integrated with one or more TFTs in accordance with any of the embodiments disclosed herein. Any of the components of the computing device 2400 may include an IC device (e.g., any embodiment of the IC structure of FIGS. 1-2) and/or an IC package 2200 (FIG. 6). Any of the components of the computing device 2400 may include an IC device assembly 2300 (FIG. 7).

A number of components are illustrated in FIG. 8 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 8, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-M RAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC structures as described herein may be particularly advantageous for use within the one or more communication chips 2412, described above. For example, such IC structures may be used to implement one or more of power amplifiers, low-noise amplifiers, filters (including arrays of filters and filter banks), switches, upconverters, downconverters, and duplexers, e.g., as a part of implementing an RF transmitter, an RF receiver, or an RF transceiver.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

SELECT EXAMPLES

The following paragraphs provide various examples of the embodiments disclosed herein.

Example 1 provides an IC structure that includes a support structure; a III-N material over the support structure; a III-N transistor provided over a first portion of the III-N material; and a TFT provided over a second portion of the III-N material.

Example 2 provides the IC structure according to example 1, where a portion of the first portion of the III-N material is a III-N channel material (or channel region) of the III-N transistor.

Example 3 provides the IC structure according to example 2, where the III-N transistor includes a polarization material (e.g., a semiconductor material having stronger piezo-polarization behavior/properties than the III-N channel material), where at least a portion of the polarization material forms a heterojunction with at least a portion of the III-N channel material.

Example 4 provides the IC structure according to example 3, where the polarization material includes aluminum, indium, gallium, and nitrogen (e.g., $Al_xIn_yGa_zN$).

Example 5 provides the IC structure according to examples 3 or 4, where a thickness of the polarization material is between about 2 and 50 nanometers, e.g., between about 10 and 30 nanometers.

Example 6 provides the IC structure according to any one of the preceding examples, where the III-N material includes nitrogen and one or more of gallium and aluminum (e.g., GaN, AlN, or AlGaN).

Example 7 provides the IC structure according to any one of the preceding examples, where the III-N material is a III-N semiconductor material having a band gap greater than a band gap of silicon (i.e., greater than about 1.1 eV), preferably greater than 1.5 eV, or greater than 2 eV. Thus, the III-N material may include, e.g., GaN, AlN, or any alloy of Al, Ga, and N, but not InN because the latter has a band gap of only about 0.65 eV.

Example 8 provides the IC structure according to any one of the preceding examples, where a thickness of the III-N material is between about 5 and 5000 nanometers, e.g., between about 5 and 1000 nanometers, between about 5 and 100 nanometers, or between about 10 and 50 nanometers.

Example 9 provides the IC structure according to any one of the preceding examples, further including a buffer material between the III-N material and the support structure, where a band gap of the buffer material is greater than a band gap of the III-N material.

Example 10 provides the IC structure according to example 9, where the buffer material includes a material including aluminum, gallium, and nitrogen (e.g., AlGaN), or a material including aluminum and nitrogen (e.g., AlN).

Example 11 provides the IC structure according to examples 9 or 10, where a thickness of the buffer material is between about 100 and 5000 nanometers, e.g., between about 250 and 500 nanometers.

Example 12 provides the IC structure according to any one of the preceding examples, where the support structure is a substrate.

Example 13 provides the IC structure according to any one of the preceding examples, where the III-N transistor is an NMOS transistor.

Example 14 provides the IC structure according to any one of the preceding examples, where the TFT is a PMOS transistor. Since III-N transistors are typically implemented as NMOS transistors, such an implementation advantageously allows integrating PMOS transistors on the same support structure over which the NMOS III-N transistors are built.

Example 15 provides the IC structure according to any one of the preceding examples, where a gate electrode of the III-N transistor is electrically coupled to, or shared with, a gate electrode of the TFT. In this manner, in the embodiments where the III-N transistor is an NMOS transistor and the TFT is a PMOS transistor, these two transistors together may be used to implement an inverter logic gate device. In other embodiments, a gate electrode of the III-N transistor may be electrically coupled to, or shared with, a gate electrode of the TFT also when both the III-N transistor and the TFT are PMOS devices, or, alternative, when both the III-N transistor and the TFT are NMOS devices. IC structures with such arrangements of same type TFT and III-N transistors may be included in any circuits that use cascaded transistors of the same type, such as gate protection circuits.

Example 16 provides the IC structure according to any one of the preceding examples, where a channel material of the TFT includes one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, and black phosphorus.

Example 17 provides the IC structure according to any one of the preceding examples, where the TFT is a top-gated transistor (i.e., the gate electrode of the TFT is not below the channel material of the TFT).

Example 18 provides the IC structure according to any one of the preceding examples, where at least a portion of a channel material of the TFT is between at least a portion of a gate dielectric material of a gate stack of the TFT and the support structure.

Example 19 provides the IC structure according to any one of the preceding examples, where at least a portion of a gate dielectric material of a gate stack of the TFT is between at least a portion of a gate electrode material of the gate stack of the TFT and the support structure.

Example 20 provides the IC structure according to any one of the preceding examples, where at least a portion of a channel material of the TFT is provided within a trench formed in the second portion of the III-N material.

Example 21 provides the IC structure according to any one of the preceding examples, where the second portion of the III-N material forms a fin, and where at least a portion of a channel material of the TFT is provided over the fin.

Example 22 provides the IC structure according to example 21, where the fin further includes a polarization material (e.g., a semiconductor material having stronger piezo-polarization behavior/properties than the III-N channel material), where at least a portion of the polarization material forms a heterojunction with at least a portion of the III-N material, between the portion of the channel material and the III-N material. In other words, in some embodiments, the fin may be formed from a stack of a layer of a polarization material disposed over a layer of a III-N material, and the channel material of the TFT may be provided over such a fin (e.g., wrapping around the top and the sidewalls of the fin).

Example 23 provides the IC structure according to example 22, where the fin further includes an insulator material between the portion of the channel material and the polarization material. In other words, in some embodiments, the fin may be formed from a stack of a layer of a polarization material disposed over a layer of a III-N material, and a layer of an insulator material disposed over the layer of the polarization material, and the channel material of the TFT may be provided over such a fin (e.g., wrapping around the top and the sidewalls of the fin).

Example 24 provides the IC structure according to any one of the preceding examples, where the III-N transistor is a part of a RF circuit, or the III-N transistor is a part of a power circuit.

Example 25 provides the IC structure according to any one of the preceding examples, where the TFT is a part of a temperature sensor circuit included in the IC structure.

Example 26 provides the IC structure according to example 25, where the temperature sensor circuit is to estimate temperature of the III-N transistor.

In various further examples, the IC structure according to any one of the preceding examples may be included in, or used to implement at least a portion of, an RF FE.

Example 27 provides an IC structure that includes a support structure; a III-N transistor provided over a first portion of the support structure; and a TFT provided over a second portion of the support structure, the second portion being different from the first portion, where at least a portion of the III-N transistor and at least a portion of the TFT are at least partially surrounded by a continuous layer of an insulator material (which indicates that at least a portion of the III-N transistor and at least a portion of the TFT are provided in a single metallization layer above the support structure).

Example 28 provides the IC structure according to example 27, where a channel material of the TFT includes one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, and black phosphorus, and a channel material of the III-N transistor includes nitrogen and one or more of gallium and aluminum (e.g., GaN, AlN, or AlGaN).

Example 29 provides the IC structure according to examples 27 or 28, where the III-N transistor is a III-N transistor according to any one of examples 1-26, and/or the TFT is a TFT according to any one of examples 1-26, and/or the IC structure is an IC structure according to any one of examples 1-26.

Example 30 provides an IC package that includes an IC die, the IC die including the IC structure according to any one of the preceding examples (e.g., any one of examples 1-29); and a further IC component, coupled to the IC die.

Example 31 provides an IC package that includes an IC die, including a III-N transistor, and a TFT, disposed in a single device layer with the III-N transistor. The IC die further includes an IC component, coupled to the IC die.

Example 32 provides the IC package according to examples 30 or 31, where the further IC component includes one of a package substrate, an interposer, or a further IC die.

Example 33 provides the IC package according to any one of the preceding examples, where the IC die includes the IC structure according to any one of the preceding examples, e.g., the IC structure according to any one of examples 1-29.

Example 34 provides a computing device that includes a carrier substrate; and an IC die coupled to the carrier substrate, where the IC die includes the IC structure according to any one of examples 1-29, and/or is included in the IC package according to any one of examples 30-33.

Example 35 provides the computing device according to example 34, where the computing device is a wearable or handheld computing device.

Example 36 provides the computing device according to examples 34 or 35, where the computing device further includes one or more communication chips and an antenna.

Example 37 provides the computing device according to any one of examples 34-36, where the carrier substrate is a motherboard.

Example 38 provides a method of manufacturing an IC structure, the method including providing a layer of a III-N semiconductor material over a support structure; providing a III-N transistor over the support structure so that a first portion of the layer of the III-N semiconductor material forms a channel material of the III-N transistor; and providing a TFT over the support structure so that a channel material of the TFT is over a second portion of the layer of the III-N semiconductor material.

Example 39 provides the method according to example 38, where providing the TFT includes forming a fin from at least a portion of the second portion of the layer of the III-N semiconductor material; providing the channel material of the TFT at least over a portion of the fin; and providing a gate stack of the TFT over at least a portion of the channel material of the TFT.

Example 40 provides the method according to example 38, where providing the TFT includes forming an opening (e.g., a trench) in at least a portion of the second portion of the layer of the III-N semiconductor material; providing the channel material of the TFT within at least a portion of the opening; and providing a gate stack of the TFT over at least a portion of the channel material of the TFT.

Example 41 provides the method according to examples 39 or 40, where providing the gate stack of the TFT includes providing a gate dielectric material of the gate stack of the TFT over at least a portion of the channel material of the TFT, and providing a gate electrode material of the gate stack of the TFT so that the gate dielectric material is between the gate electrode material and the channel material of the TFT.

Example 42 provides the method according to any one of examples 38-41, where the IC structure is the IC structure according to any one of examples 1-29, and the method includes corresponding further processes to manufacture any of these IC structures.

Example 43 provides an electronic device that includes an RF device that includes one or more of the IC structure according to any one of examples 1-26 and the IC package according to any one of examples 30-33; and, additionally, may also include a further component, coupled to the RF device.

Example 44 provides the electronic device according to example 43, where the further component is a computing device, and/or includes one or more of a communication chip and an antenna.

Example 45 provides the electronic device according to examples 43 or 44, where the further component includes one of a carrier substrate, a package substrate, an interposer, or an IC die.

Example 46 provides the electronic device according to any one of examples 43-45, where the RF device is an RF front-end component.

Example 47 provides the electronic device according to any one of examples 43-46, where the electronic device is a UE device.

Example 48 provides the electronic device according to any one of examples 43-47, where the electronic device is a base station.

Example 49 provides the electronic device according to any one of examples 43-48, where the III-N transistor of the electronic device is included in an amplifier.

Example 50 provides the electronic device according to example 49, where the III-N transistor is one of a plurality of III-N transistors included in the amplifier.

Example 51 provides the electronic device according to examples 49 or 50, where the amplifier is a low-noise amplifier.

Example 52 provides the electronic device according to example 51, where the RF device is an RF receiver.

Example 53 provides the electronic device according to any one of examples 43-52, where the RF device is an RF transceiver.

Example 54 provides the electronic device according to example 52, where the RF device is a frequency division duplex RF transceiver.

Example 55 provides the electronic device according to example 54, further including a duplexer.

Example 56 provides the electronic device according to any one of examples 43-55, further including an antenna for receiving and transmitting RF signals.

Example 57 provides the electronic device according to any one of examples 43-56, further including a downconverter for downconverting received RF signals.

Example 58 provides the electronic device according to any one of examples 43-57, further including one or more local oscillators for providing one or more local oscillator signals to be used in downconverting received RF signals.

Example 59 provides the electronic device according to any one of examples 43-58, further including an upconverter for upconverting signals to be transmitted as RF signals.

Example 60 provides the electronic device according to any one of examples 43-59, further including one or more local oscillators for providing one or more local oscillator signals to be used in upconverting the signals to be transmitted.

Example 61 provides the electronic device according to any one of examples 43-60, further including one or more analog-to-digital converters for converting signals (e.g., received signals) from analog domain to digital domain.

Example 62 provides the electronic device according to any one of examples 43-61, further including one or more digital-to-analog converters for converting signals (e.g., signals to be transmitted) from digital domain to analog domain.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
a support structure;
a III-N material over the support structure;
a polarization material over the III-N material, wherein the III-N material is between the support structure and the polarization material;
a III-N transistor, wherein a channel material of the III-N transistor includes a first portion of the III-N material, and wherein a portion of the polarization material is between the first portion of the III-N material and a gate of the III-N transistor; and
a thin-film transistor (TFT) over a second portion of the III-N material, wherein the TFT includes:
a stack of at least the second portion of the III-N material and a portion of the polarization material over the second portion of the III-N material, the stack having a shape of a fin vertically extending away from the support structure with a top of the fin being a portion of the stack that is farthest away from the support structure,
an insulator material over sidewalls and the top of the fin,
a thin-film channel material over the sidewalls and the top of the fin so that the insulator material is between the fin and the thin-film channel material,
a gate of the TFT over the sidewalls and the top of the fin so that the thin-film channel material is between the insulator material and the gate of the TFT.

2. The IC device according to claim 1, wherein the III-N transistor is an N-type transistor, the TFT is a P-type transistor, and the gate of the III-N transistor is electrically coupled to, or shared with, the gate of the TFT.

3. The IC device according to claim 1, wherein the thin-film channel material includes one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, indium gallium zinc oxide (IGZO), indium telluride, molybdenite, molybdenum diselenide, tungsten diselenide, tungsten disulfide, and black phosphorus.

4. The IC device according to claim 1, wherein the III-N transistor is a part of a radio frequency circuit, or the III-N transistor is a part of a power circuit.

5. The IC device according to claim 1, wherein the TFT is a part of a temperature sensor circuit included in the IC structure.

6. The IC device according to claim 5, wherein the temperature sensor circuit is to estimate temperature of the III-N transistor.

7. An integrated circuit (IC) package, comprising:
an IC die, including:
a III-N transistor, and
a thin-film transistor (TFT), disposed in a single device layer with the III-N transistor; and
a further IC component, coupled to the IC die,
wherein:
a source electrode of the III-N transistor, a gate of the III-N transistor, and a drain electrode of the III-N transistor are along a first line substantially parallel to the die,
a source electrode of the TFT, a gate of the TFT, and a drain electrode of the TFT are along a second line substantially parallel to the die, and
the first line is substantially perpendicular to the first line.

8. The IC package according to claim 7, wherein the further IC component includes one of a package substrate, an interposer, or a further IC die.

9. A method of fabricating an integrated circuit (IC) structure, the method comprising:
providing a stack a III-N semiconductor material and a polarization material over a support structure, wherein the III-N semiconductor material is between the support structure and the polarization material;
providing a III-N transistor over the support structure, wherein a gate of the III-N transistor is over a first portion of the stack and a channel material of the III-N transistor includes a portion of the III-N semiconductor material within the first portion of the stack;
patterning a second portion of the stack to form a fin extending away from the support structure;
depositing an insulator material on sidewalls and top of the fin; and
providing a thin-film transistor (TFT) over the support structure, wherein a channel material of the TFT wraps around the sidewalls and the top of the fin, a gate of the TFT wraps around the channel material, the channel material of the TFT is between the insulator material and the gate of the TFT, and the insulator material is between the fin and the channel material of the TFT.

10. The IC device according to claim 1, further comprising:
a source electrode for the III-N transistor;
a drain electrode for the III-N transistor;
a source electrode for the TFT; and
a drain electrode for the TFT,
wherein:
the source electrode of the III-N transistor and the drain electrode of the III-N transistor are arranged along a first line that is substantially parallel to the support structure,
the source electrode of the TFT and the drain electrode of the TFT are arranged along a second line that is substantially parallel to the support structure, and
the first line is substantially perpendicular to the first line.

11. The IC device according to claim 10, wherein:
the gate of the TFT includes a gate dielectric material and a gate electrode material,
a first portion of the gate dielectric material is between the gate electrode material and the source electrode of the TFT, and
a second portion of the gate dielectric material is between the gate electrode material and the drain electrode of the TFT.

12. The IC device according to claim 1, wherein:
the stack further includes a further insulator material, and
within the fin, the portion of the polarization material is between the second portion of the III-N material and the further insulator material.

13. The IC device according to claim 12, wherein, within the fin, the second portion of the III-N material is in a first layer, the polarization material is in a second layer, and the further insulator material is in a third layer, wherein the second layer is between the first layer and the third layer, and the first layer is between the support structure and the second layer.

14. The IC device according to claim 13, wherein the second layer is vertically stacked above the first layer, and the third layer is vertically stacked above the second layer.

15. The IC device according to claim 13, wherein each of the first layer, the second layer, and the third layer is substantially parallel to the support structure.

16. The IC device according to claim 15, wherein the third layer is between a portion of the insulator material that is over the top of the fin and the second layer.

17. The IC device according to claim 1, wherein a thickness of the thin-film channel material is between about 5 and 30 nanometers.

18. The IC device according to claim 1, wherein a band gap of the polarization material is different from a band gap of the III-N channel material.

19. The IC device according to claim 1, wherein the portion of the polarization material that is between the first portion of the III-N material and the gate of the III-N transistor is aligned with the portion of the polarization material over the second portion of the III-N material that is within the stack.

20. The method according to claim 9, wherein:
a source electrode of the III-N transistor, the gate of the III-N transistor, and a drain electrode of the III-N transistor are along a first line substantially parallel to the support structure,
a source electrode of the TFT, the gate of the TFT, and a drain electrode of the TFT are along a second line substantially parallel to the support structure, and
the first line is substantially perpendicular to the first line.

* * * * *